United States Patent [19]
Rogers et al.

[11] Patent Number: 6,010,829
[45] Date of Patent: Jan. 4, 2000

[54] POLYSILICON LINEWIDTH REDUCTION USING A BARC-POLY ETCH PROCESS

[75] Inventors: Daty Michael Rogers, Garland; Guatam V. Thaker, Plano, both of Tex.

[73] Assignee: Texas Instruments Incorporated, Dallas, Tex.

[21] Appl. No.: 08/865,358

[22] Filed: May 29, 1997

Related U.S. Application Data

[60] Provisional application No. 60/018,766, May 31, 1996.

[51] Int. Cl.[7] .................................................. G03F 7/00
[52] U.S. Cl. ........................ 430/316; 430/317; 438/717
[58] Field of Search ............................. 430/313, 30, 316, 430/317; 438/734, 16, 717; 216/41, 67, 72

[56] References Cited

U.S. PATENT DOCUMENTS

| | | | |
|---|---|---|---|
| 5,139,904 | 8/1992 | Auda et al. | 430/317 |
| 5,188,704 | 2/1993 | Babie et al. | 438/724 |
| 5,308,742 | 5/1994 | Ta | 430/313 |
| 5,316,616 | 5/1994 | Nakamura et al. | 438/721 |
| 5,330,883 | 7/1994 | Garza | 430/513 |
| 5,656,128 | 8/1997 | Hashimoto et al. | 216/47 |
| 5,665,203 | 9/1997 | Lee et al. | 438/585 |
| 5,677,111 | 10/1997 | Ogawa | 430/313 |
| 5,773,199 | 6/1998 | Linliu et al. | 430/316 |

*Primary Examiner*—John A. McPherson
*Attorney, Agent, or Firm*—Jacqueline J. Garner; Wade James Brady; Richard L. Donaldson

[57] ABSTRACT

A process for forming a polysilicon line having linewidths below 0.35 μm. The layer of polysilicon (20) is deposited over a semiconductor body (10). A layer of bottom anti-reflective coating (BARC) (30) is deposited over the polysilicon layer (20). A resist pattern (40) is formed over the BARC layer (30) using conventional lithography (e.g., I-line lithography). The resist pattern (40) has minimum dimensions of 0.30 μm or greater. The BARC layer (30) is etched using the resist pattern (40) until the endpoint is detected. The BARC layer (30) and resist pattern (40) are then overetched using an isotropic etch having a selectivity of one-to-one between the BARC and resist. The overetch is a timed etch to control the linewidth reduction in the resist/BARC pattern. The minimum dimension of the pattern (50) is reduced to below 0.3 μm. Finally, the polysilicon layer (20) is etched using the reduced width pattern (50).

18 Claims, 5 Drawing Sheets

POLYSILICON LINEWIDTH REDUCTION USING A BARC-POLY ETCH PROCESS this application claims priority under 35 USC § 119(e)(1) of provisional application No. 60/018,766, filed May 31, 1996.

FIELD OF THE INVENTION

This invention generally relates to semiconductor processing and more specifically to a process for forming polysilicon lines having a width less than 0.35 microns.

BACKGROUND OF THE INVENTION

As CMOS technology pushes deeper into the submicron region, some of the most prominent critical issues are cost, performance, and manufacture worthiness of the lithography tool needed for patterning of device dimensions less than 0.35 μm with tight critical dimension (CD) control. I-line lithography has been reliably used in 0.50 μm and 0.35 μm CMOS production However, current I-line lithography is limited to above 0.30 μm. Deep UV (ultraviolet) lithography has been proposed as the incumbent exposure tool of choice, but it currently suffers from many problems such as high capital cost per exposure tool, immaturity in the development of new DUV resist technology, and the availability of robust tools compatible with a full manufacturing environment. An alternative approach to achieving deep-submicron linewidths is resist ashing. Resist ashing techniques have been reported to produce 0.1–0.2 μm polysilicon gate length MOS devices using conventional g-line lithography. However, it is unclear whether this technique can meet the stringent CD control requirements, across the wafer (e.g., <0.025 μm) and from wafer-to-wafer (e.g., 3Sigma=0.025 μm), needed for 0.25 μm processing.

SUMMARY OF THE INVENTION

A process for forming a polysilicon line having linewidths below the lithography tool limits is disclosed herein. The layer of polysilicon is deposited over a semiconductor body. A layer of bottom anti-reflective coating (BARC) is deposited over the polysilicon layer. A resist pattern is formed over the BARC layer using conventional lithography (e.g., I-line lithography). The resist pattern has minimum dimensions of the lithography tool limits or greater. The BARC layer is etched using the resist pattern until the endpoint is detected. The BARC layer and resist pattern are then overetched using an isotropic etch having a selectivity of one-to-one between the BARC and resist The overetch is a timed etch to control the linewidth reduction in the resist/BARC pattern. The minimum dimension of the pattern is reduced to below the lithography tool limits. Finally, the polysilicon layer is etched using the reduced width pattern.

An advantage of the invention is providing a process for forming polysilicon lines having a minimum dimension less than 0.30 μm.

A further advantage of the invention is providing a process for forming polysilicon lines having a minimum dimension less than 0.30 μm that maintains a CD control less than 0.025 μm.

A further advantage of the invention is providing a process for forming polysilicon lines having a minimum dimension less than 0.30 μm that is cost effective.

These and other advantages will be apparent to those of ordinary skill in the art having reference to the specification in conjunction with the drawings.

BRIEF DESCRIPTION OF THE DRAWINGS

In the drawings:

FIGS. 11a&b are a cross-sectional and top views respectively of a polysilicon line after line width reduction according to the invention.

Corresponding numerals and symbols in the different figures refer to corresponding parts unless otherwise indicated.

DETAILED DESCRIPTION OF PREFERRED EMBODIMENTS

The invention will now be described in conjunction with I-line lithography used in forming polysilicon gates in a CMOS process. However, it will be apparent to those of ordinary skill in the art that the invention is also applicable to other lithography types (e.g., deep UV), other polysilicon lines, and other processes.

Figure 1:
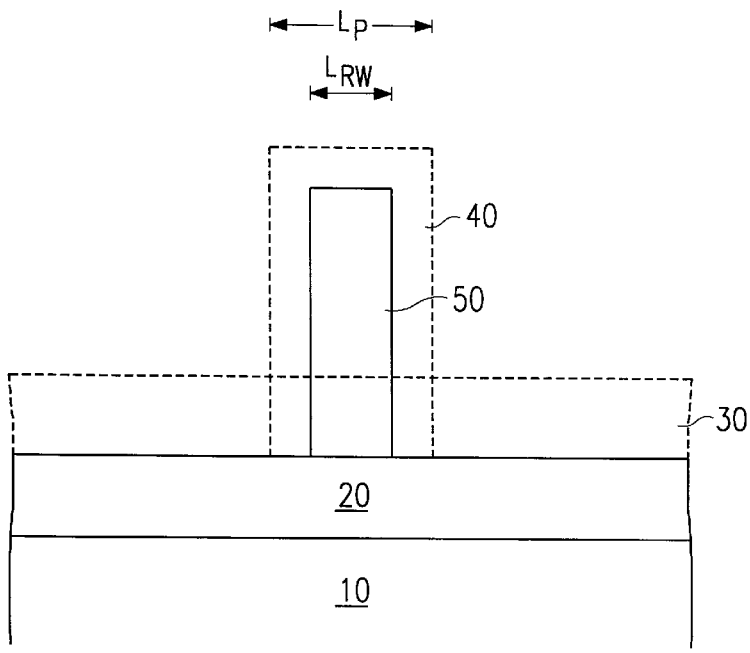
FIG. 1 is a cross-sectional diagram of a semiconductor body before and after the line width reduction according to the invention.

FIG. 1 illustrates a cross-section of a semiconductor body before and after the pattern width reduction according to the invention. The dashed lines indicate the cross-section before the linewidth reduction and the solid lines indicate the cross-section after the linewidth reduction. A resist pattern 40 having a minimum dimension Lp, greater than 0.30 μm is formed on the BARC layer 30. The minimum dimension, Lp, is determined by the lithography limits of the lithography tool being used. For I-line lithography, this is about 0.305 μm. A BARC linewidth reduction etch is then used. It consists of an endpoint etch followed by an timed overetch calculated to achieve the desired reduction in linewidth. The overetch has a selectivity between resist and BARC of approximately one-to-one. This causes a reduction in the width of pattern 40 and creates reduced width pattern 50. Reduced width pattern 50 has a minimum dimension, Lrw, less than Lp. Lrw is the desired width of the polysilicon line and may for example by 0.25 μm or 0.18 μm. Thus, polysilicon linewidths less than the limits of the lithography tool being used can reliably be achieved using this process.

Figure 2:
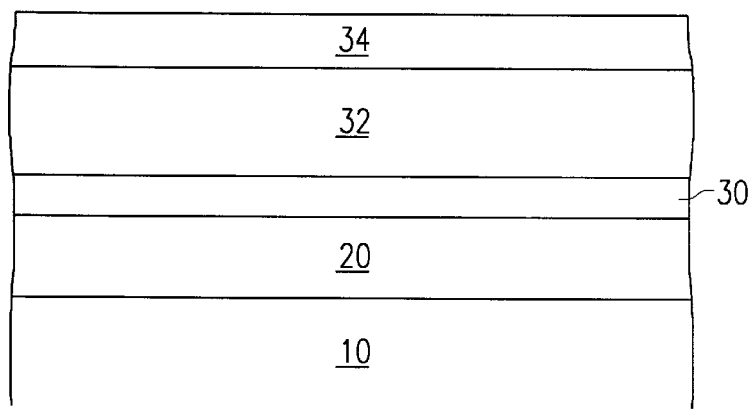
FIGS. 2–6 are a cross-sectional diagrams of a semiconductor body undergoing the process according to the invention at various stages in the process.

A more detailed explanation of the process will now be given. Referring to FIG. 2, a polysilicon layer 20 is deposited on a semiconductor body 10. The surface of semiconductor body 10 includes a gate oxide layer if a polysilicon gate is to be formed. However, the invention is not limited to polysilicon gates and may be used for polysilicon lines in general.

A BARC layer 30 is deposited over polysilicon layer 20. Example BARC materials, such as organic BARCs, will be apparent to those of ordinary skill in the art. A layer of photoresist 32 is then deposited over BARC layer 30. Various resist materials may be used to practice the invention. For example, positive tone I-line resists may be used.

The total height of the BARC and resist layers is optimized for lithographic purposes, for example, to minimize the standing wave effects and to ensure the pattern subsequently formed will survive the polysilicon layer 20 etch. It is also advantageous to have the thickness of the BARC layer 30 greater than 1500 Å. However, thickness as low as 1000 Å may be used. A thicker BARC layer increases the maximum linewidth reduction possible. For example, a BARC layer 30 thickness on the order of 2200 Å and a resist layer 32 thickness on the order of 8000 Å may be used. It should be noted that this is an example only and that many other thickness variations are possible depending on the above described optimizations and on the type of resist and BARC used. If desired, a top anti-reflective coating (TARC) 34 may also be used. The present embodiment uses a TARC thickness on the order of 640 Å. TARC 34 is advantageous for lithography purposes such as improving the critical dimension control across a wafer between densely spaced lines and less densely spaced lines.

Figure 3:
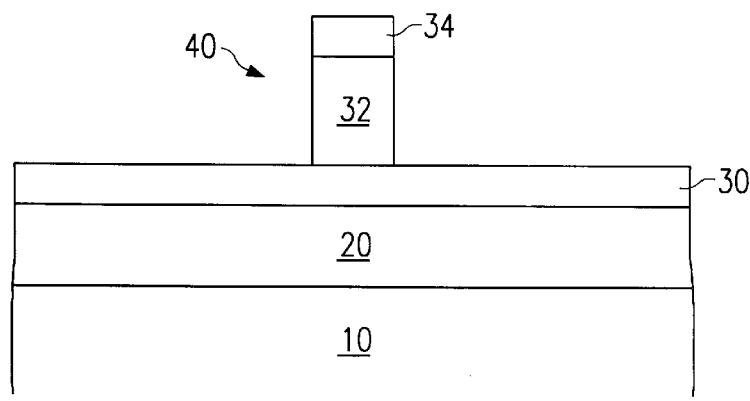

Referring to FIG. 3, a pattern 40 is created from the TARC layer 34 if present and the resist layer 32. Pattern 40 is created using standard photolithography techniques, such as I-line lithography. Pattern 40 has a minimum dimension, Lp, determined by the limits of the lithography tool. However, the Lp used may be greater than the lithographic limits. For I-line lithography, the lithographic limit is on the order of 0.305 $\mu$m. It should be noted that a reticle design minimum dimension of 0.315 $\mu$m may be used to achieve a Lp of 0.305 $\mu$m.

Figure 4:
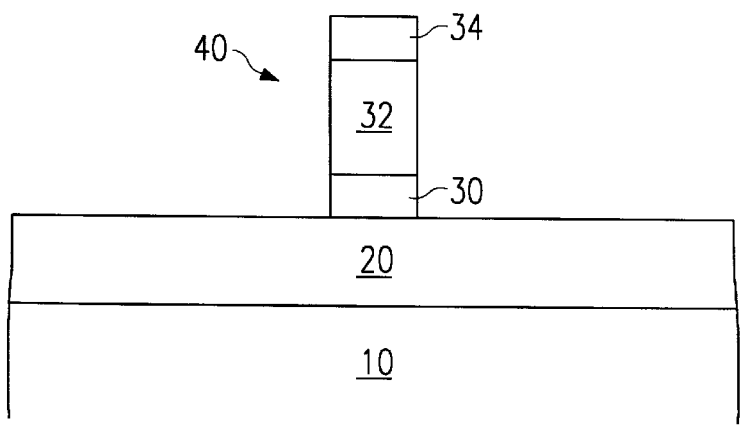
Figure 5:
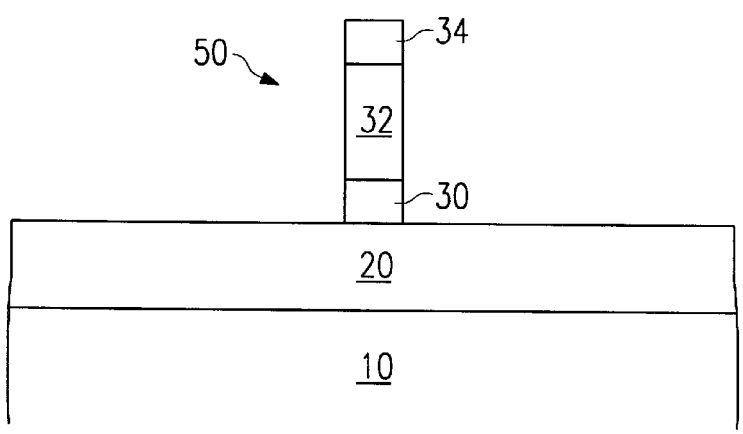

The BARC layer 30 is then etched using a two-part etch. The two-part etch may be performed in a standard oxide chamber. The first part uses a fluorine/oxygen low pressure etch to endpoint as shown in FIG. 4. Then, a timed overetch is used to achieve the desired reduction in linewidth creating reduced width pattern 50, as shown in FIG. 5. The selectivity of the etch between resist and BARC is approximately one-to-one and there is a minimal amount of polysilicon removed from polysilicon layer 20 during the overetch. The BARC 30 and resist 32 materials as well as the etch chemistry are chosen such that an etch selectivity between the BARC and resist is in the range of 0.75:1 and 1.25:1. The maximum linewidth reduction is limited at the point where there is not enough resist left to survive the subsequent polysilicon etch.

Figure 6:
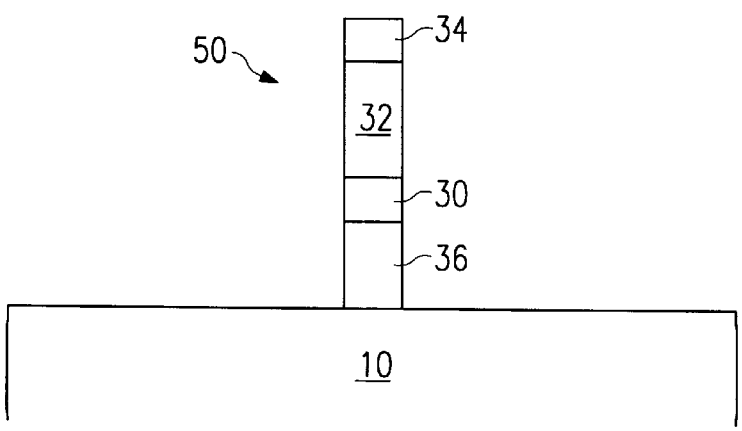

Next, the polysilicon layer 20 is etched using the reduced width pattern 50. A standard poly chamber may be used for the etch. A breakthrough etched is performed first using a fluorine/HBr low pressure chemistry. This is followed by a chlorine/HBr etch to endpoint and a highly selective high pressure HBr/oxygen overetch to clear any remaining polysilicon and remove any filaments. The resultant polysilicon line 36 is shown in FIG. 6. It should be noted that other suitable polysilicon etch processes will be apparent to those of ordinary side in the art. The polysilicon etch itself does not contribute to linewidth reduction. All reduction is controlled by the BARC etch. The entire BARC/Poly etch sequence may be done in sequence without breaking vacuum. This allows for reduced cycle time and a cleaner process.

The following is an exemplary BARC/Poly etch process according to the invention.

TABLE A

Main BARC Etch

| Chamber: | Oxide |
|---|---|
| Gases: | $CF_4$ 40 cc |
| | $O_2$ 14 cc |
| | $CHF_3$ 40 cc |
| Pressure | 50 mTorr |
| Power | 325 W |
| Gauss | 0 g. |
| | By Endpoint |

TABLE B

BARC Overetch

| Chamber: | Oxide |
|---|---|
| Gases: | $CF_4$ 40 cc |
| $O_2$ | 14 cc |
| $CHF_3$ | 40 cc |
| Pressure | 50 mTorr |
| Power | 325 W |
| Gauss | 0 g. |
| | Adjustable to target LW |

TABLE C

POLY ETCH

| | Step 1. | Step 2. | Step 3. |
|---|---|---|---|
| Chamber: | POLY | POLY | POLY |
| Gases | SF6 20 cc | Cl2 30 cc | HBr 35 cc |
| | HBr 15 cc | HBr 15 cc | He/O2 4 cc |
| Pressure: | 20 mTorr | 100 mTorr | 100 mTorr |
| Power: | 275 W | 200 W | 140 W |
| Gauss: | 30 g | 60 g | 60 g |
| | By Time | To Endpoint | 125 sec. |

This process is performed on an applied Materials P5000 platform, using the oxide and poly etch chambers. The BARC etch is process first, the BARC is cleared to endpoint, then the overetch is used to shrink the Resist/BARC linewidth, with the overetch percentage determined by the amount of linewidth reduction desired. Typically, a 45% overetch is used to achieve a 0.07 reduction in linewidth. The wafer is then sequenced to the poly chamber to remove the gate polysilicon. The first step is a breakthrough to remove any residuals and to break any native oxides on the poly. The second step is used to clear the poly to gate oxide, and is run until poly clear is seen. The third step, the overetch, is used to clean the gate oxide and remove filaments.

Figure 7:
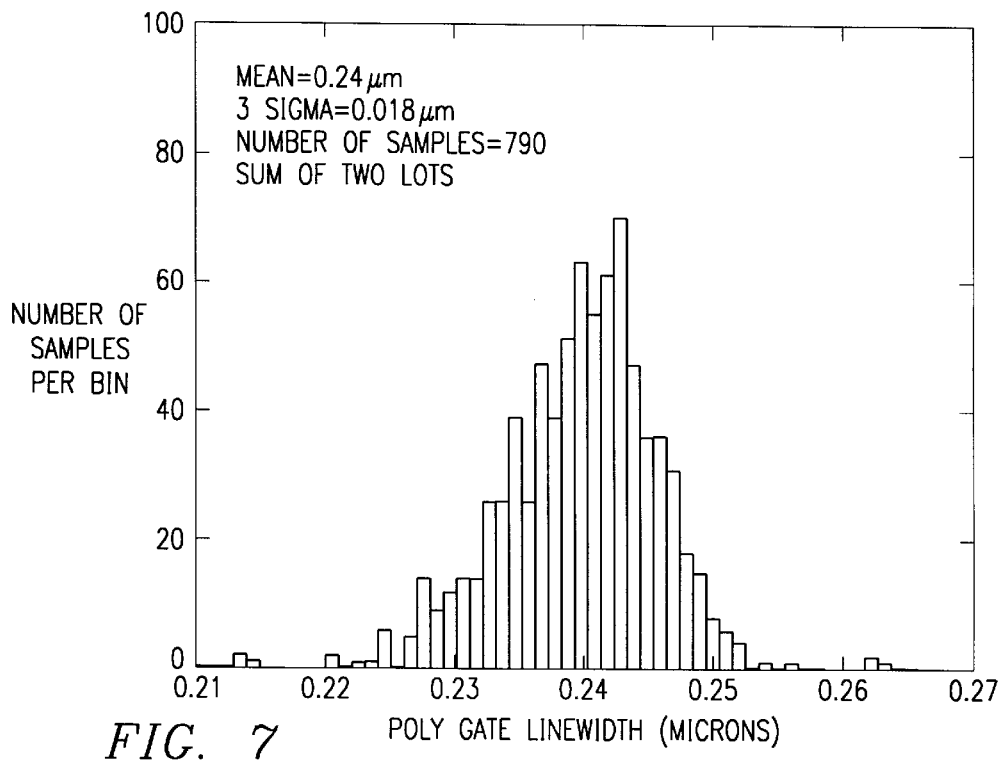
FIG. 7 is a graph of the polysilicon gate linewidth measured electrically after linewidth reduction according to the invention.

FIG. 7 shows the effect of the above BARC etch on polysilicon linewidth. It is a distribution of polysilicon linewidth measured electrically for every die and every wafer of two example lots. A BARC thickness of 2200 Å, a resist thickness of 8000 Å and a TARC thickness of 640 Å were used with a design length of 0.315 $\mu$m and a pattern length of 0.30–0.31 $\mu$m. The 3-Sigma value is 0.018 for an Lpoly of 0.24 $\mu$m. The 3-Sigma value for lot-to-lot is also 0.018. Within a lot, the wafer-to-wafer one sigma linewidth variation is less than ±0.0028 $\mu$m. This indicates that this process meets the strict CD control requirements needed for 0.25 $\mu$m processes.

Figure 8:
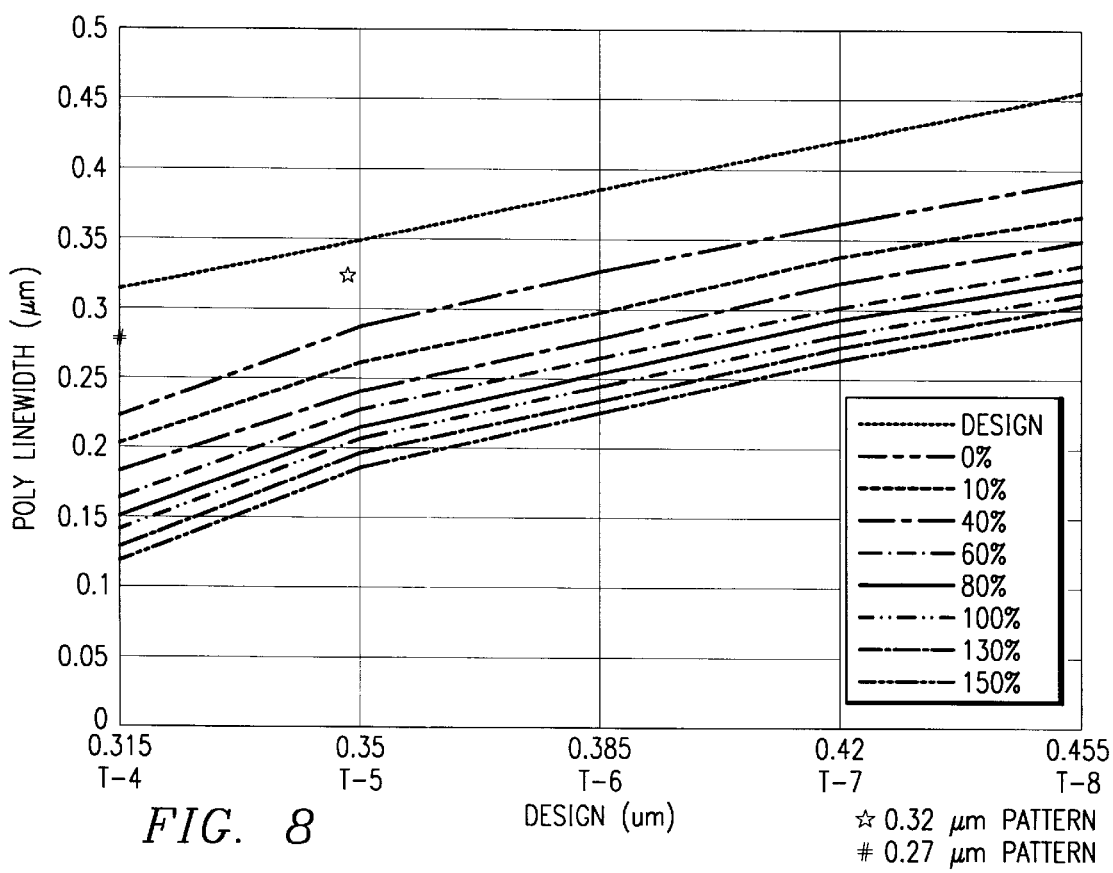
FIG. 8 is a graph of resulting polysilicon linewidth versus lithographic design linewidth for various BARC overetches.

FIG. 8 is a graph of lithographic pattern design linewidth versus resulting polysilicon linewidth for various BARC overetches. It illustrates that linewidths of 0.12 to 0.14 $\mu$m are possible using the process according to the invention. It also illustrates that for a lithographic pattern design linewidths in the range of 0.315–0.455 $\mu$m, the linewidth reduction is relatively linear for a given percentage overetch. Thus, the overetch required for a desired linewidth reduction may be readily calculated.

Figure 9:
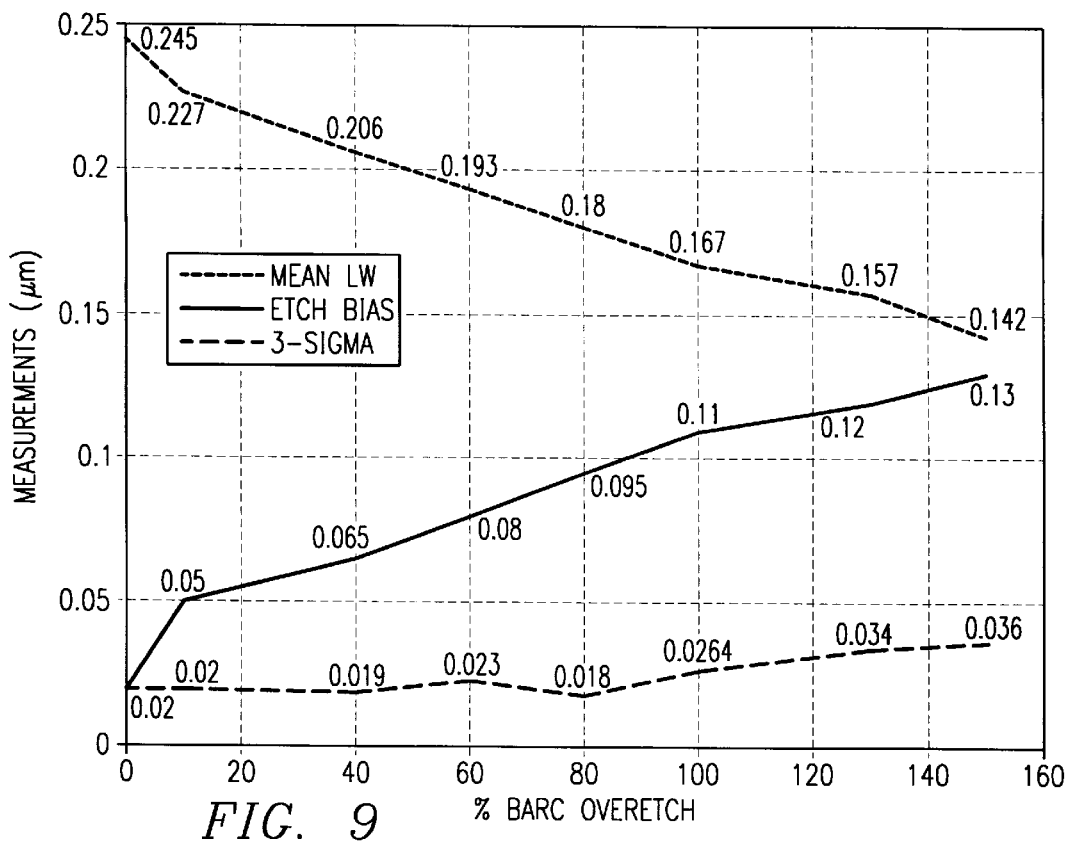
FIG. 9 is a graph of mean linewidth etch bias and 3 Sigma measurements versus BARC overetch percentage.
Figure 10:
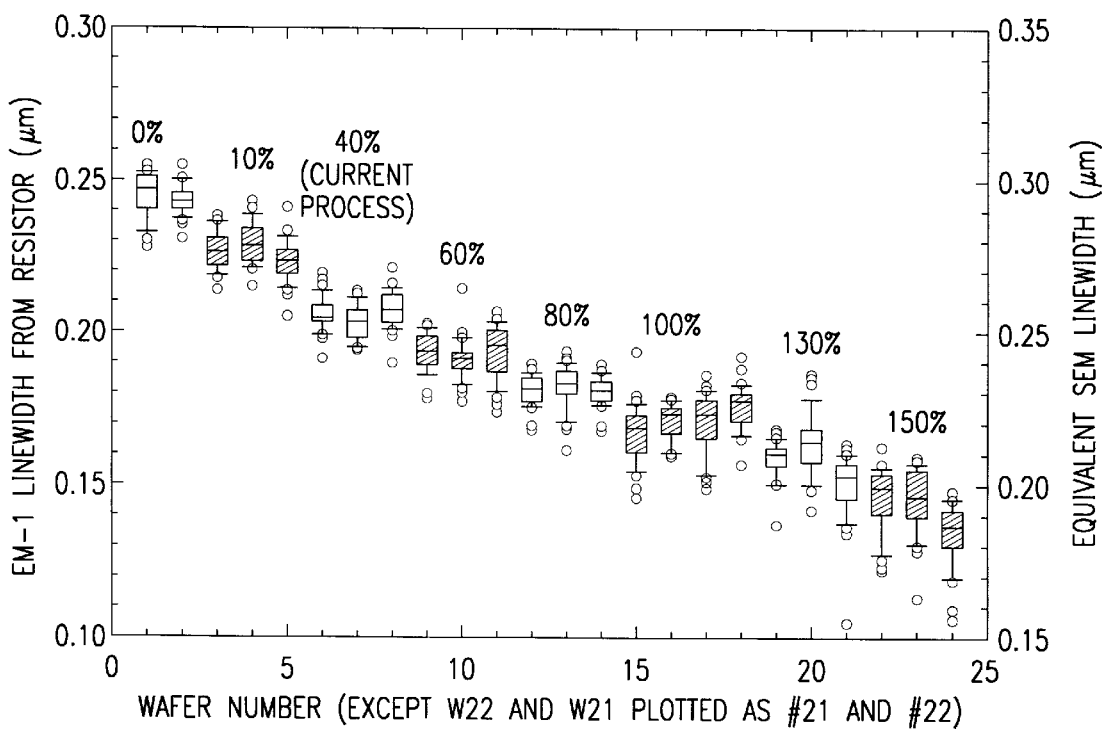
FIG. 10 is a graph of polysilicon linewidth versus BARC etch bias.

FIG. 9 is a graph of the effect of polysilicon linewidth reduction on uniformity. Measurements of mean linewidth, etch bias, and 3-Sigma versus percent of BARC overetch are plotted. Uniformity is maintained at least down to linewidths of 0.142 $\mu$m and overetches up to 150%. FIG. 10 is a graph of polysilicon linewidths (electrical and equivalent SEM) for various BARC overetch percentages. There is no noticeable increase in variability until the overetch approaches 130%.

Figures 11A, 11B:
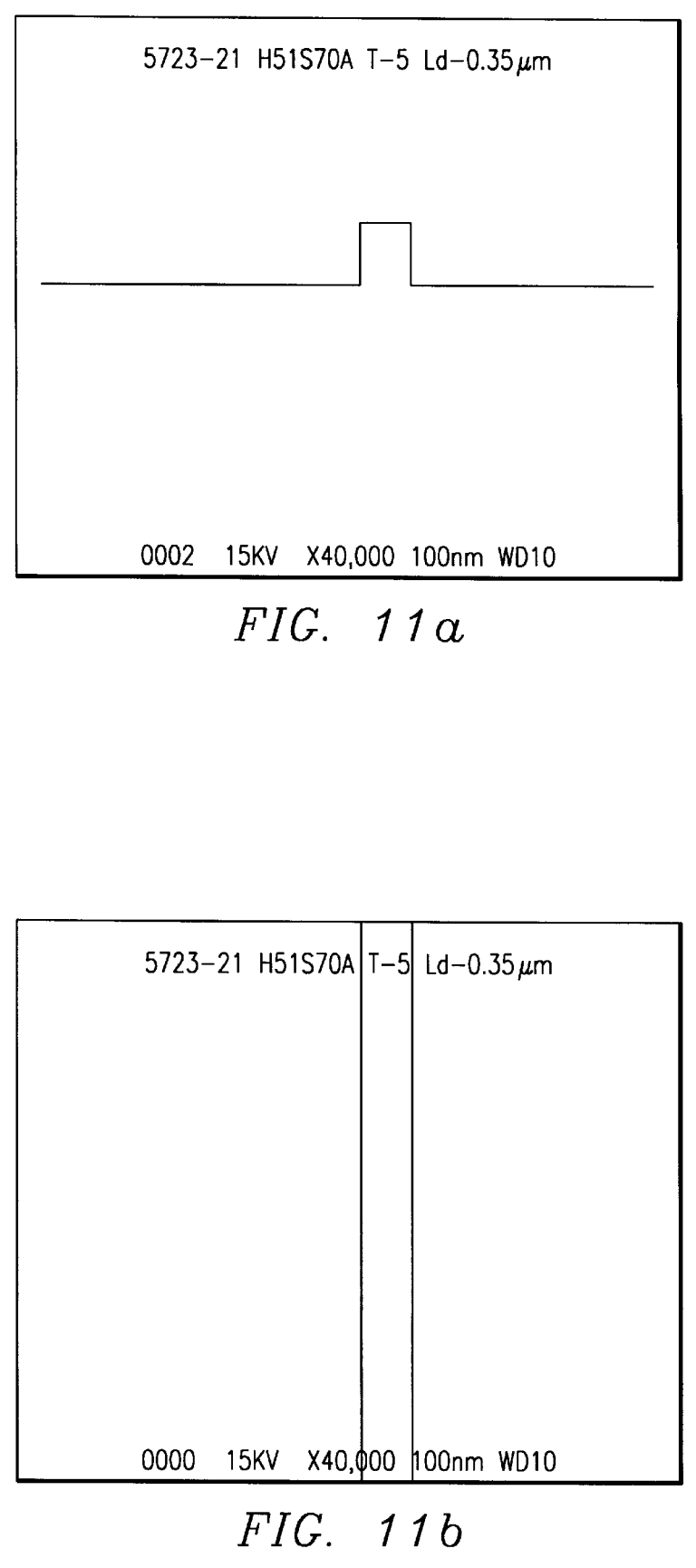

FIGS. 11a&b are cross-section and top views respectively of a polysilicon line processed according to the invention using a 150% BARC overetch and a design linewidth of 0.350 $\mu$m. The polysilicon line has an electrical linewidth of 0.187 $\mu$m.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description It is therefore intended that the appended claims encompass any such modifications or embodiments.

What is claimed is:

1. A method of forming a polysilicon line, comprising the steps of:
   depositing a layer of polysilicon;
   depositing a layer of bottom anti-reflective coating (BARC) over the polysilicon layer;
   depositing a layer of resist over said BARC layer;
   removing portions of said resist layer using a lithographic tool to create a resist pattern having a width greater than or equal to a minimum lithographic limit of the lithographic tool;
   etching said BARC layer using said resist pattern until an endpoint is detected;
   isotropically overetching said BARC layer and said resist pattern using a timed etch that has a selectivity between the BARC layer and the resist pattern of one to one to create a reduced width pattern;
   etching said polysilicon layer using said reduced width pattern to create said polysilicon line.

2. The method of claim 1, wherein said BARC layer has a thickness greater than 1000 Å.

3. The method of claim 1, wherein said reduced width pattern has a width less than said minimum lithographic limit.

4. The method of claim 1, wherein said reduced width pattern has a width in the range of 0.1 to 0.29 $\mu$m.

5. The method of claim 1, wherein said reduced width pattern has a width less than the width of said resist pattern by an amount of 0.18 $\mu$m or less.

6. The method of claim 1, further comprising the step of depositing a top anti-reflective coating over said resist layer prior to said step of removing portions of said resist layer, wherein said step of removing portions of said resist layer also removes portions of said top anti-reflective coating.

7. The method of claim 1, wherein said steps of etching said BARC layer and isotropically overetching said BARC layer use an etch chemistry of $CF_4$, $O_2$ and $CHF_3$.

8. The method of claim 1, wherein said step of etching said polysilicon layer comprises the steps of:
   performing a breakthrough etch using an etch chemistry of $SF_6$ and HBr;
   performing an endpoint etch using an etch chemistry of $Cl_2$ and HBr; and
   performing an overetch using an etch chemistry of HBr and $He/O_2$.

9. The method of claim 1, wherein said BARC layer has a thickness on the order of 2200 Å and said resist layer has a thickness on the order of 8000 Å.

10. The method of claim 1, wherein said isotropic overetching step is an overetch in the range of 10% to 150%.

11. A method of forming a polysilicon line having a linewidth less than 0.30 $\mu$m, comprising the steps of:
   depositing a layer of polysilicon;
   depositing a layer of bottom anti-reflective coating (BARC) over the polysilicon layer;
   depositing a layer of resist over said BARC layer;
   depositing a layer of top anti-reflective coating over said resist layer;
   removing portions of said resist layer and said top anti-reflective coating to create a resist pattern having a width greater than or equal to 0.30 $\mu$m using an I-line lithographic tool;
   isotropically etching said BARC layer using said resist pattern until an endpoint is detected and then continuing the etch for a selected time to overetch said BARC layer and said resist pattern, wherein said etch has a selectivity between the BARC layer and the resist pattern of one to one such that a reduced width pattern having a width less than 0.30 $\mu$m is created;
   etching said polysilicon layer using said reduced width pattern to create said polysilicon line.

12. The method of claim 11, wherein said BARC layer has a thickness greater than 1000 Å.

13. The method of claim 11, wherein said reduced width pattern has a width in the range of 0.1 to 0.29 $\mu$m.

14. The method of claim 11, wherein said reduced width pattern has a width less than the width of said resist pattern by an amount of 0.18 $\mu$m or less.

15. The method of claim 11, wherein said step of isotropically etching said BARC layer uses an etch chemistry of $CF_4$, $O_2$ and $CHF_3$.

16. The method of claim 11, wherein said step of etching said polysilicon layer comprises the steps of:
   performing a breakthrough etch using an etch chemistry of $SF_6$ and HBr;
   performing an endpoint etch using an etch chemistry of $Cl_2$ and HBr; and
   performing an overetch using an etch chemistry of HBr and $He/O_2$.

17. The method of claim 11, wherein said BARC layer has a thickness on the order of 2200 Å and said resist layer has a thickness on the order of 8000 Å.

18. The method of claim 11, wherein said isotropically etching step continues after said endpoint for an overetch in the range of 10% to 150%.

* * * * *